(12) United States Patent
Cubero Pitel et al.

(10) Patent No.: US 9,204,553 B2
(45) Date of Patent: Dec. 1, 2015

(54) METHOD FOR PRODUCING A PRINTED CIRCUIT BOARD

(75) Inventors: Jose Antonio Cubero Pitel, Valls (ES); Andreu Fores Montserrat, Valls (ES); Maria Leonor Torrijos Ezquerra, Valls (ES)

(73) Assignee: Lear Corporation, Southfield, MI (US)

( * ) Notice: Subject to any disclaimer, the term of this patent is extended or adjusted under 35 U.S.C. 154(b) by 280 days.

(21) Appl. No.: 13/582,149

(22) PCT Filed: Mar. 22, 2011

(86) PCT No.: PCT/US2011/029355
§ 371 (c)(1),
(2), (4) Date: Aug. 31, 2012

(87) PCT Pub. No.: WO2011/119558
PCT Pub. Date: Sep. 29, 2011

(65) Prior Publication Data
US 2012/0317805 A1  Dec. 20, 2012

Related U.S. Application Data

(60) Provisional application No. 61/316,756, filed on Mar. 23, 2010.

(51) Int. Cl.
*H05K 3/20* (2006.01)
*H05K 3/06* (2006.01)
*H05K 3/24* (2006.01)
*H05K 1/09* (2006.01)

(52) U.S. Cl.
CPC .................. *H05K 3/06* (2013.01); *H05K 3/243* (2013.01); *H05K 1/09* (2013.01); *H05K 2201/0376* (2013.01); *H05K 2201/09881* (2013.01); *Y10T 29/49155* (2015.01)

(58) Field of Classification Search
USPC ............ 29/831, 835, 838, 846, 854; 174/254, 174/520, 522, 536; 312/223.1, 223.2, 312/223.6; 439/595, 637
See application file for complete search history.

(56) References Cited

U.S. PATENT DOCUMENTS

| | | |
|---|---|---|
| 5,886,409 A | 3/1999 | Ishino et al. |
| 6,539,624 B1 * | 4/2003 | Kung et al. ..................... 29/843 |
| 6,541,303 B2 * | 4/2003 | Akram et al. ................. 438/106 |

(Continued)

FOREIGN PATENT DOCUMENTS

| | | |
|---|---|---|
| CN | 1164128 A | 11/1997 |
| JP | 2001257465 | 9/2001 |

(Continued)

OTHER PUBLICATIONS

International Search Report, Application No. PCT/US2011/029355 dated Dec. 28, 2011.

(Continued)

*Primary Examiner* — Paul D Kim
(74) *Attorney, Agent, or Firm* — MacMillan, Sobanski & Todd, LLC

(57) ABSTRACT

A method is provided for producing a printed circuit board. The method includes the step of providing an insulating substrate having a layer of aluminum material applied to the substrate. A portion of the layer of aluminum material is removed for defining a circuit trace. A layer of conductive material is applied to the layer of aluminum material.

8 Claims, 3 Drawing Sheets

(56) References Cited

U.S. PATENT DOCUMENTS

| | | |
|---|---|---|
| 6,596,384 B1 | 7/2003 | Day et al. |
| 6,734,570 B1 * | 5/2004 | Archer ............... 257/786 |
| 6,861,745 B2 * | 3/2005 | Akram et al. ........... 257/706 |
| 7,235,148 B2 | 6/2007 | Day et al. |

FOREIGN PATENT DOCUMENTS

| | | |
|---|---|---|
| JP | 2001284815 | 10/2001 |
| JP | 2002016329 | 1/2002 |
| JP | 2003309355 | 10/2003 |
| WO | 2010020753 A2 | 2/2010 |

OTHER PUBLICATIONS

Written Opinion, Application No. PCT/US2011/029355 dated Dec. 28, 2011.

Chinese First Office Action, Application No. 201180009938.4 dated Oct. 10, 2014.

* cited by examiner

METHOD FOR PRODUCING A PRINTED CIRCUIT BOARD

BACKGROUND OF THE INVENTION

This invention relates in general to printed circuit boards, such as can be used in electrical junction boxes for motor vehicles. In particular, this invention relates to a printed circuit board having aluminum traces with a solderable layer of material applied thereto and to a method for producing such a printed circuit board.

Electrical junction boxes are used in motor vehicles to connect plug-in components to wire harnesses by a series of electrical connectors. The electrical connectors are mounted on a printed circuit board located within the junction box. A typical printed circuit board includes an insulating substrate, such as a dielectric laminar board, that provides corresponding apertures for securing the electrical connectors to the board. The printed circuit board further includes circuit traces that are disposed on a surface of the board for connecting the electrical connectors with one another or other components on the circuit board. The electrical connectors are soldered to the circuit traces for providing a secure electrical connection.

Known circuit traces are generally made of copper or a copper alloy. Copper provides superior electrical performance compared to other metals and enables other components to be easily soldered thereto. However, copper can add to the cost and weight of the junction box. Thus, it is also known to make circuit traces from aluminum or aluminum alloys. Aluminum provides comparable electrical performance and is relatively lightweight compared to copper. However, it can be difficult to apply a soldered connection to the surface of aluminum.

Although known printed circuit boards function in an acceptable manner, it is desirable to provide a printed circuit board having aluminum traces with a solderable layer of material applied thereto and to a method for producing such a printed circuit board.

SUMMARY OF THE INVENTION

This invention relates to a method for producing a printed circuit board. The method includes the step of providing an insulating substrate having a layer of aluminum material applied to the substrate. A portion of the layer of aluminum material is removed for defining a circuit trace. A layer of conductive material is applied to the layer of aluminum material.

Various aspects of this invention will become apparent to those skilled in the art from the following detailed description of the preferred embodiment, when read in light of the accompanying drawings.

DETAILED DESCRIPTION OF THE PREFERRED EMBODIMENT

Figure 1:
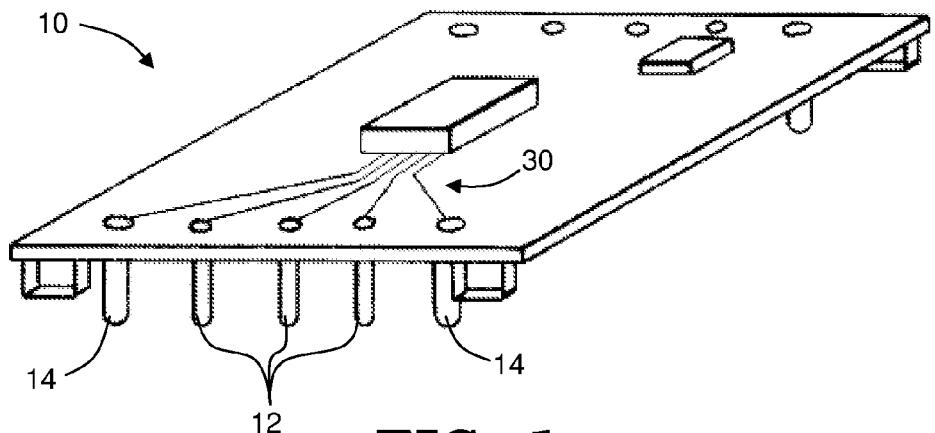
FIG. 1 is a perspective view of a printed circuit board assembly in accordance with this invention.

Referring now to the drawings, there is illustrated in FIG. 1 a printed circuit board assembly, indicated generally at 10, in accordance with this invention. The printed circuit board assembly 10 can be used in a wide variety of electronic devices to connect and mount various electrical components. For example, the printed circuit board assembly 10 can be incorporated in an electrical junction box (not shown) for use in power applications of motor vehicles. The electrical junction box is adapted to connect plug-in components to wire harnesses by a series of electrical connectors. The electrical connectors are mounted to the printed circuit board assembly 10 and may be embodied as pins 12, blades 14, or any other structures adapted to provide an electrical connection. As shown, the various electrical connectors can be electrically connected with one another or to other components by circuit traces 30. Other non-illustrated components that can be connected to the printed circuit board assembly 10 may include but are not limited to relays, fuse terminals, transistors, and any through-hole technology (THT) components or surface mount devices (SMD). Although the invention will be described and illustrated in the context of printed circuit boards for use in automotive junction boxes, it should be appreciated that this invention may be used in any desired environment and for any desired purpose.

FIGS. 2 through 8 illustrate a method for producing the printed circuit board assembly 10 illustrated in FIG. 1 in accordance with this invention. Thus, it should be appreciated that this invention provides an improved printed circuit board and a method for producing such a printed circuit board.

Figure 2:
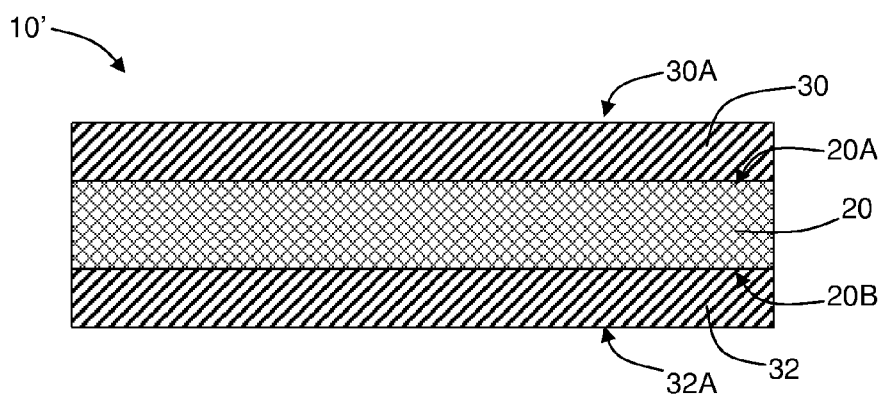
FIG. 2 is a cross-sectional side view of a circuit board shown in an initial condition prior to any processes in accordance with this invention being performed thereon.

Referring now to FIG. 2, a circuit board 10' is shown prior to any processes being performed thereon. The illustrated circuit board 10' may initially be a metal-clad structure that includes an insulating substrate 20. The insulating substrate 20 is, in large measure, conventional in the art and may be embodied as an electrically non-conductive laminar board. For example, the insulating substrate 20 can be formed from any dielectric material used for such applications, including those commonly referred to as FR2 (flame retardant 2), FR3, FR4, CEM1, CEM2, CEM3, and the like. The insulating substrate defines a first surface 20A and a second, opposite surface 20B. It should be appreciated that the insulating substrate 20 is not limited to the embodiment described and illustrated herein, but may define any structure suitable for a desired application.

The illustrated circuit board 10' includes a first layer 30 and a second layer 32 of clad material that are subsequently shaped so as to define the circuit traces, as will be explained below. The first layer 30 is disposed on the first surface 20A of the insulating substrate 20 and the second layer 32 is disposed on the second surface 20B of the insulating substrate 20. Optionally, only a single layer of clad material may otherwise be provided on a single surface if so desired and be processed in accordance with this invention. As shown, the first layer 30 defines an outer surface 30A and the second layer 32 defines an outer surface 32A. The outer surfaces 30A, 32A are generally planar surfaces that correspond with the board, but may also define any non-planar features if so desired. Circuit boards incorporated in electrical junction boxes for use in motor vehicles typically have a thickness exceeding 200 microns, for example in the order of 400 microns, although this invention can be applied to circuit boards having a thickness less than 200 microns or greater than 400 microns.

The first layer 30 and the second layer 32 can be secured to the insulating substrate 20 in any manner, including but not limited to the use of a laminating process or an adhesive. For example, an arrangement of the substrate 20 and the first layer 30 and the second layer 32 may be heated and pressurized to form a laminate structure. The heat may cause the substrate 20 to soften or otherwise melt, thereby providing a suitable bond to the first layer 30 and the second layer 32.

The first layer 30 and the second layer 32 are formed from an electrically conductive material that is relatively lightweight, as compared to copper for example. In one embodiment, the first layer 30 and the second layer 32 are made of an aluminum or aluminum alloy material. Although the first layer 30 and the second layer 32 will be described hereinafter as being made of aluminum, it should be understood that the clad layers can be made of any conductive material that is relatively lightweight and suitable for use in automotive junction boxes or any other desired applications.

Figure 3:
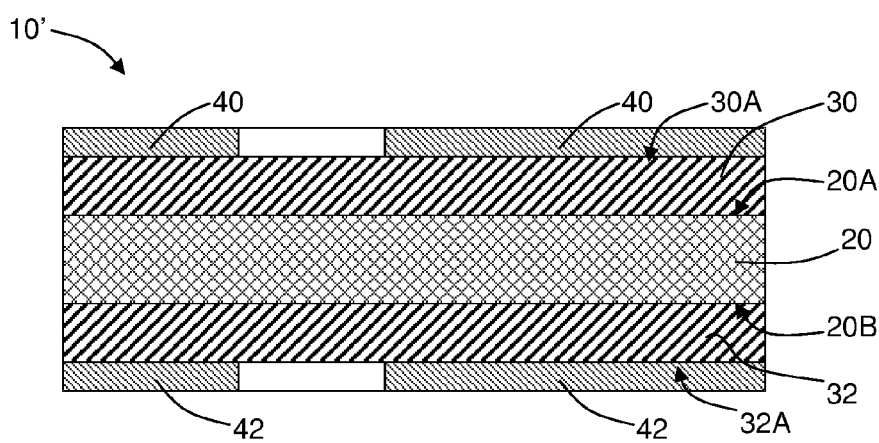
FIG. 3 is a cross-sectional side view of the circuit board in FIG. 2 shown subsequent to an etch-resistant masking process being performed thereon.

Referring now to FIG. 3, the circuit board 10' is illustrated subsequent to the application of an etch-resistant mask. As will be further explained below, the first layer 30 and the second layer 32 are chemically milled using an etching process to form desired electrical paths or circuit traces in the respective layers. Prior to the etching process, an etch-resistant mask or etching mask 40 can be selectively applied to the outer surface 30A of the first layer 30. Similarly, a second etching mask 42 may be applied to the outer surface 32A of the second layer 32. The etching masks 40, 42 are configured to prevent the selected portions of the first layer 30 and the second layer 32 from being etched. As such, the etching masks 40, 42 can be any material that is configured to resist etching. For example, the etching masks 40, 42 can be silicon dioxide, silicon nitride, or a photoresist material. In other embodiments, the circuit traces may alternatively be formed using an etching process that does not require the etching masks 40, 42.

As briefly explained above, the etching masks 40, 42 are selectively applied to portions of the outer surfaces 30A, 32A so as to define the desired circuit traces. The etching masks 40, 42 can be applied to the outer surfaces 30A, 32A using a variety of techniques that depend, in large measure, on the etching process and/or etching solution selected. For example, the etching masks 40, 42 can be applied to the outer surfaces 30A, 32A using conventional printing techniques such as silk-screening, photoresist techniques such as photolithography, or any other suitable techniques for a desired application.

The first layer 30 and the second layer 32 can be etched using any suitable etching process. For example, in a wet etching process the illustrated circuit board 10' can be immersed into an etching solution (i.e. etchant) and agitated for a specified amount of time. The etchant is configured to dissolve the unmasked portions of the first layer 30 and the second layer 32 thereby exposing the insulating substrate 20. For example, the etchant can be potassium hydroxide, ferric chloride, hydrochloric acid, an aqueous solution of ethylene diamine and pyrocatechol, or any other solution. It should be appreciated that the etching process of an aluminum laminate may be precisely controlled by defining various parameters including, but not limited to etching solutions and concentrations, immersion time, etching mask composition and thickness, etc. The first layer 30 and the second layer 32 may, alternatively, be etched using a dry etching process such as plasma etching.

Figure 4:
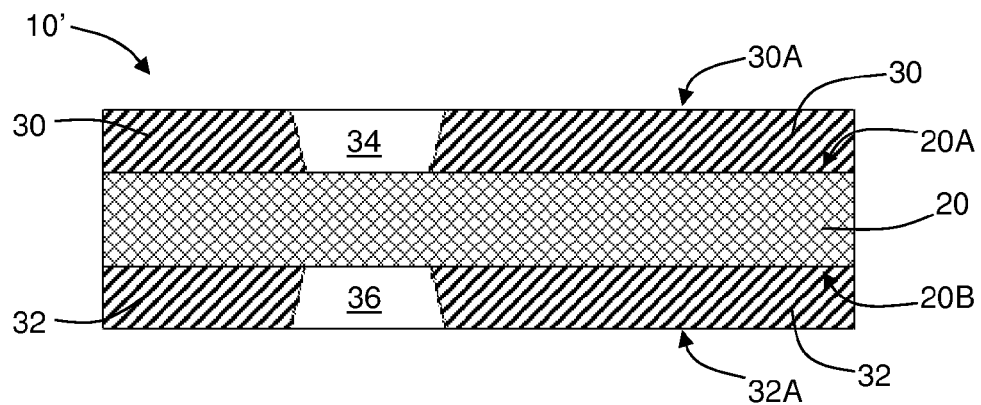
FIG. 4 is a cross-sectional side view of the circuit board in FIG. 3 shown subsequent to an etching process being performed thereon.

Referring now to FIG. 4, the circuit board 10' is illustrated subsequent to an etching process as described above. As shown, the etching process removes the unmasked portions (i.e. exposed portions) of the first layer 30 and the second layer 32 from the insulating substrate 20. Thus, portions of the first layer 30 and the second layer 32 that remain on the insulating substrate 20 (i.e. masked portions) define the desired circuit traces. In the illustrated embodiment, the first layer 30 defines a first channel 34 that separates the first layer 30 into individual traces to form a plurality of circuit traces. Similarly, the second layer 32 defines a second channel 36 that separates the second layer 32 into individual traces to form additional circuit traces on the backside of the circuit board 10'. Subsequently, the etching mask 40 can be stripped or otherwise removed from the first layer 30 and the second layer 32 to expose the outer surfaces 30A, 32A, which can be accomplished using any cleansing process. The circuit board 10' may then be rinsed and subjected to an electrical check in order to identify defective boards.

Figure 5:
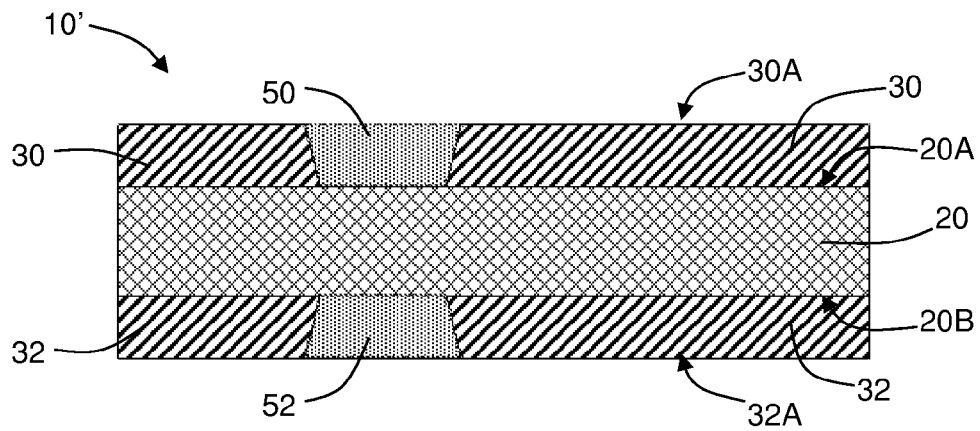
FIG. 5 is a cross-sectional side view of the circuit board in FIG. 4 shown subsequent to a gap filling process being performed thereon.

Referring now to FIG. 5, the circuit board 10' is illustrated subsequent to a gap filling process. In this step, the first and second channels 34, 36 (i.e. etched portions) are filled to form a first gap filler 50 and a second gap filler 52. The filler material can be a non-conductive, insulating material such as an acrylic resin, epoxy resin, or any other suitable material. The first and second gap fillers 50, 52 are configured to provide a generally flush surface along the outer surfaces 30A, 32A and protect the otherwise exposed side walls of the first layer 30 and the second layer 32 (as shown in FIG. 4). It should be appreciated that the channels 34, 36 may be protected other than as described and illustrated herein or, alternatively, that the circuit board 10' need not include the gap fillers 50, 52 at all.

The filler material can be deposited into the first and second channels 34, 36 in any suitable manner. For example, the filler material may be provided in the form of a liquid that is applied to the first layer 30 thereby filling the first channel 34. The outer surface 30A can be wiped clean to remove any excess filler material on the first layer 30. The filler material may then be cured by heat or ultraviolet radiation to form the gap filler 50. The same process can be repeated to form the gap filler 52 of the second layer 32. Alternatively, the excess filler material may be removed by a grinding or polishing step subsequent to curing of the filler material.

Figure 6:
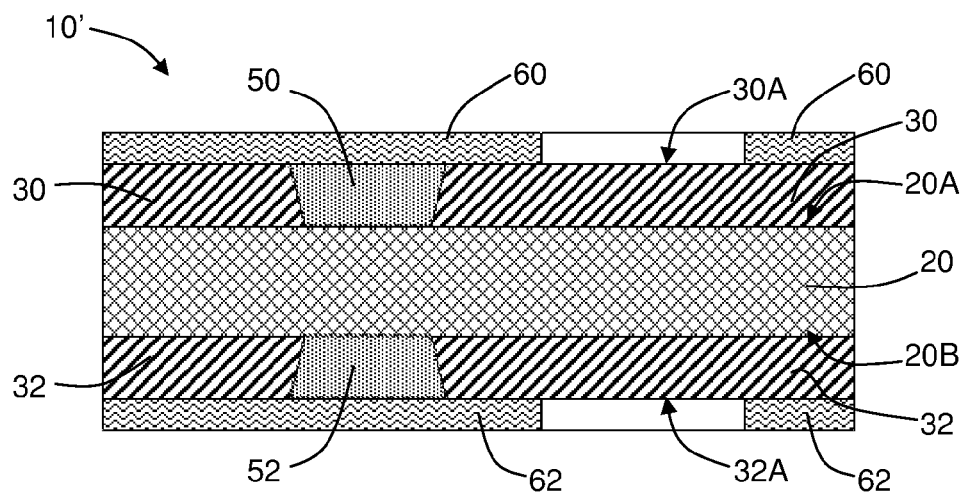
FIG. 6 is a cross-sectional side view of the circuit board in FIG. 5 shown subsequent to a solder masking process being performed thereon.

Referring now to FIG. 6, the circuit board 10' is illustrated subsequent to the application of a solder-resistant mask. As briefly explained above, various electrical components may be soldered to the circuit board 10'. Thus, a first solder-resistant mask 60 can be selectively applied to the outer surface 30A of the first layer 30. Similarly, a second solder-resistant mask 62 can be selectively applied to the outer surface 32A of the second layer 32. The solder-resistant masks 60, 62 form a protective layer on the circuit board 10' exposing only small areas or pads of the outer surfaces 30A, 32A. The solder-resistant masks 60, 62 can be any material configured to mask portions of the circuit traces, although such is not required.

The solder-resistant masks 60, 62 may be selectively applied to the outer surfaces 30A, 32A using any conventional printing techniques such as, for example, a silk-screening process. The solder-resistant masks 60, 62 may then be cured by heat or ultraviolet radiation. It should be appreciated, however, that the circuit board 10' need not include the solder-resistant masks 60, 62 if so desired.

Other examples and descriptions of suitable manufacturing processes for producing portions of the circuit board 10' are disclosed in U.S. Pat. No. 6,969,471 to Pitel, which is incorporated herein by reference.

Figure 7:
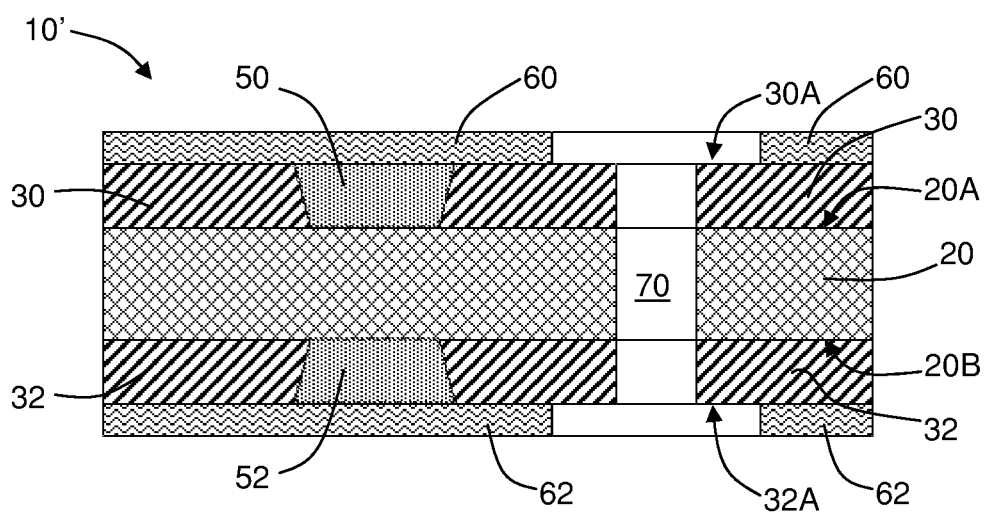
FIG. 7 is a cross-sectional side view of the circuit board in FIG. 6 shown subsequent to the formation of an aperture.

Referring now to FIG. 7, the circuit board 10' is illustrated subsequent to the formation of an aperture. As briefly described above, various electrical connectors can be mounted on the circuit board 10'. To accomplish this, an aperture 70 can be formed in the circuit board 10' to individually receive the various electrical connectors. For example, the aperture 70 can be drilled or punched through the first layer 30, the insulating substrate 20, and the second layer 32. A desired electrical connector (not shown) can be inserted into the aperture 70 such that the first layer 30 and the second layer 32 are connected with the electrical connector to provide an electrical connection therebetween. As such, the aperture 70 may define a cross-sectional shape that provides for frictional engagement between the electrical connector and the first layer 30 and the second layer 32. Alternatively, only one of the first layer 30 and the second layer 32 may be engaged with the electrical connector if so desired. Thus, the aperture 70 can be used to mount the electrical connector using any through-hole technology (THT), although such is not required for this invention. In other embodiments, the desired electrical connector can be forcefully punched through the circuit board 10' at any step of the manufacturing process. Any electrical connector or component can be attached to the circuit board 10' accordingly, including but not limited to a pin 12 (shown in FIG. 1), a blade 14 (also shown in FIG. 1), fuse terminals, and any through-hole technology (THT) component or the like. It should also be appreciated that inner walls of the aperture 70 may be plated using an intermediate step involving chemical introduction of copper within the aperture 70. This configuration can electrically connect the first layer 30 and the second layer 32 without the need for an electrical connector to be inserted into the aperture 70.

Figure 8:
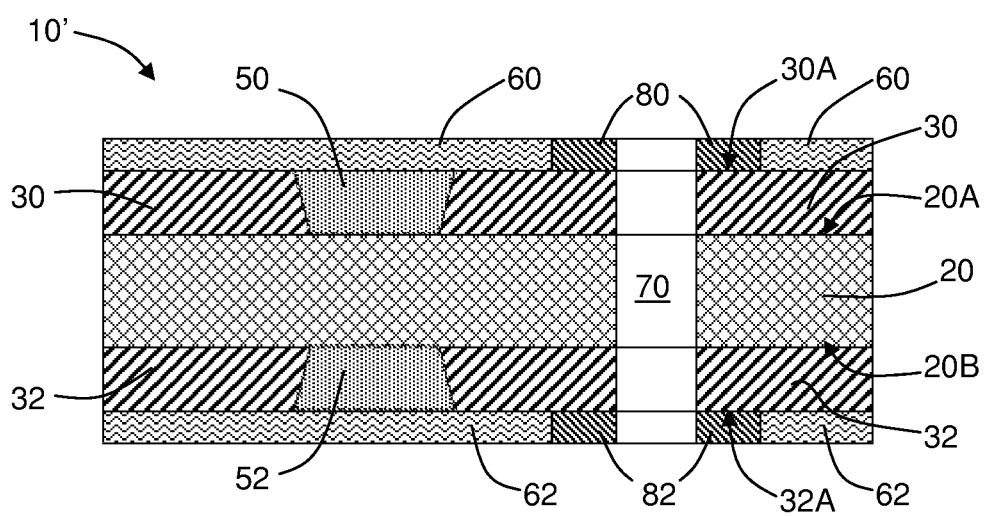
FIG. 8 is a cross-sectional side view of the circuit board in FIG. 7 shown subsequent to a plating process being performed thereon.

Referring now to FIG. 8, the circuit board 10' is illustrated subsequent to a layer of solderable material 80, 82, described below, being applied to the exposed outer surfaces 30A, 32A of the respective layers. Prior to this process, the exposed outer surfaces 30A, 32A can be activated by a surface treatment process as follows. First, the exposed outer surfaces 30A, 32A are cleaned using a chemical degreasing process. The chemical degreasing process is, in large measure, conventional in the art and removes oxide, grease, and other contaminates from the exposed outer surfaces 30A, 32A. The circuit board 10' may be subsequently rinsed using distilled water or the like. Second, the exposed outer surfaces 30A, 32A are activated using an etching process. For example, the etching process may utilize a weak acid solution that is configured to activate the exposed outer surfaces 30A, 32A for proper plate adhesion of a layer of solderable material, as will be explained below. Again, the circuit board 10' may be subsequently rinsed using distilled water or the like. Third, the exposed outer surfaces 30A, 32A are prepared for subsequent electrolytic or electroless plating. To accomplish this, the outer surfaces 30A, 32A are treated with a special amalgam of an alkaline solution to perform a zincate process that produces a zinc deposit. The zinc deposit maximizes adhesion of the layer of solderable material during the plating process. It should be appreciated that various parameters of the surface treatment process, such as for example the etching solution and amalgam, may be varied in order to achieve desired surface finishes of the exposed outer surfaces 30A, 32A for a selected plating process.

Subsequent to the surface treatment described above, a first layer of solderable material 80 can be plated to the exposed outer surface 30A of the first layer 30. Similarly, a second layer of solderable material 82 can be plated to the exposed outer surface 32A of the second layer 32. For example, the layers of solderable material 80, 82 can be formed using an electroless nickel plating (EN) process. The electroless nickel plating (EN) process deposits a layer of nickel on the exposed outer surfaces 30A, 32A of the first layer 30 and the second layer 32 respectively thereby forming the layers of solderable material 80, 82. Once the outer surfaces 30A, 32A have been plated using the electroless nickel plating (EN) process, an additional layer of conductive material may be applied to one or both of the layers of solderable material 80, 82. The layer of conductive material may be any conductive material such as copper, nickel, gold, tin, palladium, and/or silver that is applied to the layers of solderable material 80, 82 using any plating process. For example, additional surface plating processes that may be used to apply the additional layer of solderable material to the layers of solderable material 80, 82 include but are not limited to electroless nickel immersion gold (ENIG), electroless immersion tin (Im-Sn), electroless immersion silver (Im-Ag), electroless nickel electroless palladium (ENEP), and organic surface protection (OSP). Thus, the various electrical components described above can be soldered, for example by a conventional flow soldering process, to the outer surfaces of the first layer of solderable material 80 and the second layer of solderable material 82 respectively for attachment to the circuit board 10'. Although the illustrated embodiment includes an aperture 70, it should be appreciated that the processes described herein can be performed on the outer surfaces 30A, 32A without an aperture 70 formed therein, such as for example with surface mount devices (SMD).

The principle and mode of operation of this invention have been explained and illustrated in its preferred embodiment. However, it must be understood that this invention may be practiced otherwise than as specifically explained and illustrated without departing from its spirit or scope.

What is claimed is:

1. A method for producing a printed circuit board comprising the steps of:
providing an insulating printed circuit board substrate having a clad layer of aluminum disposed thereon;
removing a portion of the clad layer of aluminum for defining circuit traces;
applying a layer of solderable material onto, and in conductive relation with, at least a portion of the clad layer of aluminum using an electroless nickel plating (EN) process; and
applying a layer of conductive material to the layer of solderable material.

2. The method of claim 1, further including the steps of: cleaning a surface of the clad layer of aluminum to remove contaminates prior to applying the layer of solderable material; activating the surface of the clad layer of aluminum using an etching process prior to applying the layer of solderable material; and treating the surface of the clad layer of aluminum with an alkaline solution prior to applying the layer of solderable material.

3. The method of claim 1, further comprising the step of applying the layer of conductive material to the layer of solderable material using one of the following processes: electroless nickel immersion gold (ENIG); electroless immersion tin (Im-Sn); electroless immersion silver (Im-Ag); electroless nickel electroless palladium (ENEP); and organic surface protection (OSP).

4. A method for producing a printed circuit board comprising the steps of:
providing an insulating printed circuit board substrate having a layer of aluminum material applied thereto;
removing a portion of the layer of aluminum material for defining a circuit trace;
applying a layer of solderable material onto, and in conductive relation with, at least a portion of the layer of aluminum material; and
applying a layer of conductive material to the layer of solderable material using a plating process.

5. The method of claim 4, wherein the step of applying a layer of conductive material to the layer of solderable material is performed by using an electroless nickel immersion gold (ENIG) process.

6. The method of claim 4, wherein the layer of conductive material is applied to the layer of solderable material using one of the following processes: electroless nickel immersion gold (ENIG); electroless immersion tin (Im-Sn); electroless immersion silver (Im-Ag); electroless nickel electroless palladium (ENEP); and organic surface protection (OSP).

7. A method for producing a printed circuit board comprising the steps of:
providing an insulating printed circuit board substrate having a layer of aluminum material applied thereto;
removing a portion of the layer of aluminum material for defining a circuit trace, wherein a channel is defined between adjacent portions of the circuit trace;
applying a layer of solderable material onto, and in conductive relation with, at least a portion of the layer of aluminum material; and
filling a portion of the channel with non-conductive filler material.

8. The method of claim 7, wherein the portion of the channel having non-conductive filler material provided therein includes non-conductive filler material in an amount such that an outer surface of the filler material in the channel is generally flush with outer surfaces of the adjacent portions of the circuit trace.

\* \* \* \* \*